United States Patent
Shimada et al.

(10) Patent No.: US 9,422,512 B2
(45) Date of Patent: Aug. 23, 2016

(54) CLEANING LIQUID FOR SEMICONDUCTOR ELEMENTS AND CLEANING METHOD USING SAME

(71) Applicant: MITSUBISHI GAS CHEMICAL COMPANY, INC., Chiyoda-ku (JP)

(72) Inventors: Kenji Shimada, Tokyo (JP); Toshiyuki Oie, Tokyo (JP); Ryota Nakayama, Tokyo (JP); Masaru Ohto, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 14/432,040

(22) PCT Filed: Nov. 29, 2013

(86) PCT No.: PCT/JP2013/082130
§ 371 (c)(1),
(2) Date: Mar. 27, 2015

(87) PCT Pub. No.: WO2014/087925
PCT Pub. Date: Jun. 12, 2014

(65) Prior Publication Data
US 2015/0210966 A1    Jul. 30, 2015

(30) Foreign Application Priority Data
Dec. 3, 2012 (JP) ................ 2012-264091

(51) Int. Cl.
*C11D 3/39* (2006.01)
*C11D 11/00* (2006.01)
(Continued)

(52) U.S. Cl.
CPC .......... *C11D 11/0047* (2013.01); *C11D 3/3947* (2013.01); *C11D 7/04* (2013.01);
(Continued)

(58) Field of Classification Search
CPC ........ C11D 11/0047; C11D 7/06; C11D 7/36; C11D 1/62; C11D 3/43; C11D 3/044; C11D 3/3942
See application file for complete search history.

(56) References Cited

U.S. PATENT DOCUMENTS

2010/0029085 A1* 2/2010 Matsunaga ............. G03F 7/423
438/737
2011/0230053 A1* 9/2011 Matsuda ................. C23F 1/38
438/745

FOREIGN PATENT DOCUMENTS

JP    2007 211035    8/2007
JP    2008 285508    11/2008
(Continued)

OTHER PUBLICATIONS

International Search Report Issued Feb. 18, 2014 in PCT/JP2013/082130 Filed Nov. 29, 2013.

*Primary Examiner* — Gregory Webb
(74) *Attorney, Agent, or Firm* — Oblon, McClelland, Maier & Neustadt, L.L.P

(57) ABSTRACT

By cleaning with use of a cleaning liquid that contains 10-30% by mass of hydrogen peroxide, 0.005-10% by mass of a quaternary ammonium hydroxide, 0.005-5% by mass of potassium hydroxide, 0.000005-0.005% by mass of an amino polymethylene phosphonic acid and water, a hard mask, an organosiloxane-based thin film, dry etching residue and a photoresist can be removed without corroding a low-dielectric-constant interlayer dielectric film, a wiring material such as copper or an copper alloy, a barrier metal and a barrier dielectric film. According to preferred embodiments of the present invention, damage to copper wiring lines is suppressed even in cases where an acid is added into the cleaning liquid and significant decomposition of hydrogen peroxide is not caused even in cases where titanium is added into the cleaning liquid.

9 Claims, 1 Drawing Sheet

(51) Int. Cl.
  C23G 1/20      (2006.01)
  H01L 21/02     (2006.01)
  H01L 21/311    (2006.01)
  H01L 21/3213   (2006.01)
  C11D 7/06      (2006.01)
  C11D 7/32      (2006.01)
  C11D 7/36      (2006.01)
  C11D 7/04      (2006.01)
  H01L 21/033    (2006.01)
  H01L 21/768    (2006.01)
  H01L 23/532    (2006.01)

(52) U.S. Cl.
  CPC ............... *C11D 7/06* (2013.01); *C11D 7/3209* (2013.01); *C11D 7/36* (2013.01); *C23G 1/20* (2013.01); *C23G 1/205* (2013.01); *H01L 21/02063* (2013.01); *H01L 21/0332* (2013.01); *H01L 21/0337* (2013.01); *H01L 21/31133* (2013.01); *H01L 21/32134* (2013.01); *H01L 21/76814* (2013.01); *H01L 21/76883* (2013.01); *H01L 21/31144* (2013.01); *H01L 21/32139* (2013.01); *H01L 23/53238* (2013.01); *H01L 23/53295* (2013.01); *H01L 2924/0002* (2013.01)

(56) References Cited

FOREIGN PATENT DOCUMENTS

| | | |
|---|---|---|
| JP | 2009 231354 | 10/2009 |
| JP | 2010 10273 | 1/2010 |
| WO | 2008 114616 | 9/2008 |

* cited by examiner

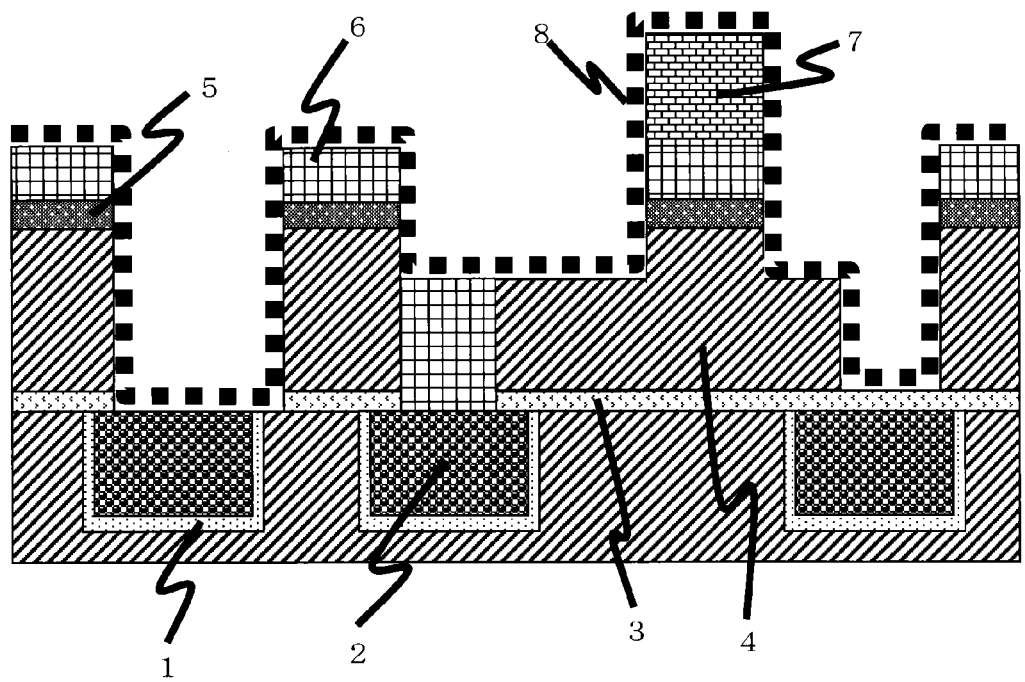

US 9,422,512 B2

CLEANING LIQUID FOR SEMICONDUCTOR ELEMENTS AND CLEANING METHOD USING SAME

TECHNICAL FIELD

The present invention relates to a cleaning liquid to be used in the process of manufacturing a semiconductor integrated circuit and a cleaning method using the same. The present invention particularly relates to a cleaning liquid, wherein: a barrier dielectric film, a low-dielectric-constant interlayer dielectric film, a hard mask, an organosiloxane-based thin film and a photoresist are laminated on a substrate having a barrier metal, a copper wiring or copper alloy wiring and a low-dielectric-constant interlayer dielectric film; after that, the photoresist is subjected to selective exposure and development to form a photoresist pattern; and then a semiconductor device in which the organosiloxane-based thin film, the hard mask, the low-dielectric-constant interlayer dielectric film and the barrier dielectric film are subjected to dry etching utilizing the photoresist pattern as a mask is cleaned by the cleaning liquid to remove the organosiloxane-based thin film, the hard mask, dry etching residue and the photoresist while suppressing damage to the low-dielectric-constant interlayer dielectric film, the copper wiring, the barrier metal and the barrier dielectric film, and a cleaning method using the same.

BACKGROUND ART

In the production of a highly integrated semiconductor element, usually, a conductive thin film such as a metal film as a conductive wiring material and an interlayer dielectric film for insulation between conductive thin films are formed on an element such as a silicon wafer, and after that, a photoresist is homogeneously applied to the surface thereof to provide a photosensitive layer, which is subjected to selective exposure and development to form a desired resist pattern. Next, the interlayer dielectric film is subjected to the dry etching treatment using the resist pattern as a mask, thereby forming a desired pattern on the thin film. Then the resist pattern and residue generated by the dry etching treatment (hereinafter referred to as "dry etching residue") are completely removed by ashing with oxygen plasma, a cleaning liquid or the like. Such a series of processes is generally carried out.

Recently, the design rule has been more and more shrunken, and RC delay has controlled the limit of high-speed processing. For this reason, the conductive wiring material has been changed from aluminum to copper which has lower electric resistance, and with this, the interlayer dielectric film has been changed from a silicon dioxide film to a low-dielectric-constant interlayer dielectric film (a film having a dielectric constant of lower than 3; hereinafter referred to as a "low-dielectric-constant interlayer dielectric film"). Further, in order to prevent diffusion of copper in the interlayer dielectric film, copper is covered with a metal such as tantalum and tantalum nitride (hereinafter referred to as a "barrier metal") and an insulating film such as silicon nitride and silicon carbide (hereinafter referred to as a "barrier dielectric film"). In addition, between the photoresist and the interlayer dielectric film, a film having the function of planarization by being filled in a gap such as concavity and convexity, a groove or the like in a base element, the function to absorb radiation reflected from the element and the function to maintain the shape of the interlayer dielectric film at the time of dry etching to facilitate precise microfabrication, tends to be more often used. As such a film, for example, an organosiloxane thin film including a light-absorbing compound (hereinafter referred to as an "organosiloxane-based thin film") is used. Further, in the case of forming a pattern of 0.2 µm or less, when a resist having a film thickness of 1 µm is used, the aspect ratio of the pattern (the ratio obtained by dividing the resist film thickness by the resist line width) becomes too high, causing problems such as collapse of the pattern. In order to solve the problems, a hard mask method, in which: a Ti-based or Si-based film (hereinafter referred to as a "hard mask") is inserted between a film which is desired to be actually formed a pattern and a resist film; a resist pattern is transferred to the hard mask by dry etching; and after that, the pattern is transferred to the film which is desired to be actually formed the pattern by dry etching, using the hard mask as an etching mask, may be used. In this method, the gas to be used for etching the hard mask may be different from the gas to be used for etching the film which is desired to be actually formed the pattern. When etching the hard mask, a gas which doesn't etch the resist can be selected, and when etching the actual film, a gas which doesn't etch the hard mask can be selected. Therefore, the method is advantageous on the point that a pattern can be formed with a thin resist.

However, when the hard mask, the organosiloxane-based thin film and the photoresist are removed by oxygen plasma, the low-dielectric-constant interlayer dielectric film existing under the organosiloxane-based thin film may be exposed to oxygen plasma or the like and damaged. For example, in the case of pattern formation by a via-first dual damascene process, when the organosiloxane-based thin film filled in a via portion is removed by oxygen plasma, the low-dielectric-constant interlayer dielectric film around the via portion is damaged, causing the problem of significant degradation of electrical characteristics. Meanwhile, in the process of removing the hard mask and the organosiloxane-based thin film, since dry etching residue adheres to the wafer, it is required to remove the dry etching residue simultaneously. Accordingly, in the production of semiconductor elements in which the low-dielectric-constant interlayer dielectric film is used, a method, in which the hard mask, the organosiloxane-based thin film and the photoresist are removed at a level equal to that of the oxygen plasma process while suppressing damage to the low-dielectric-constant interlayer dielectric film, the copper, the barrier metal and the barrier dielectric film, and in which dry etching residue is removed simultaneously, is desired.

Recently, use of a fluorocarbon-based gas in dry etching has become popular, and therefore, fluorine is contained in dry etching residue. For this reason, fluorine is mixed into the cleaning liquid in the process of removing the dry etching residue. Fluorine seriously damages the low-dielectric-constant interlayer dielectric film and the copper particularly when the pH becomes acidic. However, even when the pH of the cleaning liquid was not acidic, there was a case where serious damage to the low-dielectric-constant interlayer dielectric film and the copper was observed when cleaning the semiconductor element with the cleaning liquid after use for removal of dry etching residue. The cause for the damage is not clear, but it is expected that a part of dry etching residue becomes an acid such as $H_2SiF_6$ as in the case of dissolving $SiO_2$ with HF when subjecting the low-dielectric-constant interlayer dielectric film containing Si or O to dry etching with the fluorocarbon-based gas. Since fluorine also exists on the semiconductor element because of the influence of dry etching gas, it is considered that hydrofluoric acid is locally formed during cleaning with the cleaning liquid, causing damage to the low-dielectric-constant interlayer dielectric film and the copper. Therefore, a method for cleaning a semiconductor element, in which the low-dielectric-constant interlayer dielectric film and the copper are not damaged even when dry etching residue is mixed into the cleaning liquid, is desired.

For a hard mask, titanium or titanium nitride may be used. In this case, when the hard mask is removed with a cleaning liquid, titanium gets mixed with the cleaning liquid. In the case of a cleaning liquid containing hydrogen peroxide, when titanium is mixed therewith, decomposition of hydrogen peroxide is accelerated to worsen the preservation stability of the cleaning liquid. Therefore, a method for suppressing decomposition of hydrogen peroxide caused by titanium which gets mixed with the cleaning liquid is desired.

Patent Document 1 proposes a method for cleaning semiconductor elements with a cleaning liquid comprising hydrogen peroxide, amino polymethylene phosphonic acids, potassium hydroxide and water.

Patent Document 2 proposes a cleaning liquid that is a liquid for treating wiring substrates, which comprises hydrogen peroxide, quaternary ammonium hydroxide and an anticorrosive of tungsten and has a pH of 7 to 10, wherein the anticorrosive of tungsten is at least one selected from the group consisting of quaternary ammonium and a salt thereof, quaternary pyridinium and a salt thereof, quaternary bipyridinium and a salt thereof and quaternary imidazolium and a salt thereof.

Patent Document 3 proposes a titanium nitride removing liquid which comprises 10 to 40% by mass of hydrogen peroxide and tetraalkylammonium hydroxide and has a pH of 6.0 to 8.2 at 25° C.

Patent Document 4 proposes a cleaning liquid for semiconductor devices which comprises an oxidant, a metal etching agent and a surfactant and has a pH of 10 to 14.

Patent Document 5 proposes a polyester produced using a titanium complex compound as the main catalyst, and as a chelating agent of the titanium complex compound, the document mentions hydroxy polycarboxylic acid and/or nitrogen-containing polycarboxylic acid.

PRIOR ART DOCUMENTS

Patent Documents

Patent Document 1: WO2008/114616
Patent Document 2: Japanese Laid-Open Patent Publication No. 2008-285508
Patent Document 3: Japanese Laid-Open Patent Publication No. 2010-10273
Patent Document 4: Japanese Laid-Open Patent Publication No. 2009-231354
Patent Document 5: Japanese Laid-Open Patent Publication No. 2007-211035

SUMMARY OF THE INVENTION

Problems to be Solved by the Invention

However, in Patent Documents 1-5, there are problems that it is impossible to sufficiently remove a hard mask, an organosiloxane-based thin film, a photoresist and dry etching residue, and that when an acid gets mixed with a cleaning liquid, it is impossible to sufficiently suppress damage to copper. Moreover, for example, there is also a problem that significant decomposition of hydrogen peroxide is caused when titanium gets mixed with a cleaning liquid (see Comparative Examples 1-5 described below).

In view of the above-described conventional problems, one problem of the present invention is to provide a cleaning liquid for removing an organosiloxane-based thin film, a hard mask, dry etching residue and a photoresist while suppressing damage to a low-dielectric-constant interlayer dielectric film, a copper wiring, a barrier metal and a barrier dielectric film and a cleaning method using the same. Moreover, another problem of the present invention is to provide a cleaning liquid, which suppresses damage to a copper wiring even when an acid is added to the cleaning liquid and does not cause significant decomposition of hydrogen peroxide even when titanium is added to the cleaning liquid, and a cleaning method using the same.

Means for Solving the Problems

The present invention includes the following embodiments:

<1> A cleaning liquid for removing an organosiloxane-based thin film, a hard mask, a dry etching residue and a photoresist,
wherein the cleaning liquid comprises 10 to 30% by mass of hydrogen peroxide, 0.005 to 10% by mass of a quaternary ammonium hydroxide, 0.005 to 5% by mass of potassium hydroxide, 0.000005 to 0.005% by mass of an amino polymethylene phosphonic acid and water,
wherein a barrier dielectric film, a low-dielectric-constant interlayer dielectric film, the hard mask, the organosiloxane-based thin film and the photoresist are laminated in order on a substrate having a barrier metal, a copper wiring or copper alloy wiring and a low-dielectric-constant interlayer dielectric film; after that, the photoresist is subjected to selective exposure and development to form a photoresist pattern; and then a semiconductor element in which the organosiloxane-based thin film, the hard mask, the low-dielectric-constant interlayer dielectric film and the barrier dielectric film are subjected to dry etching utilizing the photoresist pattern as a mask is cleaned by the cleaning liquid to remove the organosiloxane-based thin film, the hard mask, the dry etching residue and the photoresist.

<2> The cleaning liquid according to item <1>, wherein the hard mask comprises titanium nitride or titanium.

<3> The cleaning liquid according to item <1> or <2>, wherein the quaternary ammonium hydroxide is at least one selected from the group consisting of tetramethylammonium hydroxide, tetraethylammonium hydroxide, tetrapropylammonium hydroxide, tetrabutylammonium hydroxide and benzyltrimethylammonium hydroxide.

<4> The cleaning liquid according to any one of items <1> to <3>, wherein the amino polymethylene phosphonic acid is at least one selected from the group consisting of amino tri(methylene phosphonic acid), ethylenediamine tetra(methylene phosphonic acid), diethylenetriamine penta(methylene phosphonic acid) and 1,2-propylenediamine tetra(methylene phosphonic acid).

<5> The cleaning liquid according to any one of items <1> to <4>, wherein the sodium concentration is 0.1 ppm or less.

<6> A method for cleaning a semiconductor element, comprising removing a hard mask, an organosiloxane-based thin film, a dry etching residue and a photoresist using a cleaning liquid comprising 10 to 30% by mass of hydrogen peroxide, 0.005 to 10% by mass of a quaternary ammonium hydroxide, 0.005 to 5% by mass of potassium hydroxide, 0.000005 to 0.005% by mass of an amino polymethylene phosphonic acid and water,
wherein a barrier dielectric film, a low-dielectric-constant interlayer dielectric film, the hard mask, the organosiloxane-based thin film and the photoresist are laminated on a substrate having a barrier metal, a copper wiring or copper alloy wiring and a low-dielectric-constant interlayer dielectric film; after that, the photoresist is subjected to selective exposure and development to form a photoresist pattern; and then the semiconductor element in which the organosiloxane-based thin film, the hard mask, the low-dielectric-constant interlayer dielectric film and the barrier dielectric film are subjected to dry etching utilizing the photoresist pattern as a mask is cleaned by the cleaning liquid to remove the hard mask, the organosiloxane-based thin film, the dry etching residue and the photoresist.

<7> The cleaning method according to item <6>, wherein the hard mask comprises titanium nitride or titanium.

<8> The cleaning method according to item <6> or <7>, wherein the quaternary ammonium hydroxide is at least one selected from the group consisting of tetramethylammonium hydroxide, tetraethylammonium hydroxide, tetrapropylammonium hydroxide, tetrabutylammonium hydroxide and benzyltrimethylammonium hydroxide.

<9> The cleaning method according to any one of items <6> to <8>, wherein the amino polymethylene phosphonic acid is at least one selected from the group consisting of amino tri(methylene phosphonic acid), ethylenediamine tetra(methylene phosphonic acid), diethylenetriamine penta(methylene phosphonic acid) and 1,2-propylenediamine tetra(methylene phosphonic acid).

<10> The cleaning method according to any one of items <6> to <9>, wherein the sodium content is 0.1 ppm or less.

Advantageous Effect of the Invention

According to a preferred embodiment of the present invention, it is possible to provide a cleaning liquid for removing a hard mask, an organosiloxane-based thin film, dry etching residue and a photoresist while suppressing damage to a low-dielectric-constant interlayer dielectric film, a copper wiring, a barrier metal and a barrier dielectric film and a cleaning method using the same. Moreover, according to a preferred embodiment of the present invention, it is possible to provide a cleaning liquid, which suppresses damage to a copper wiring even when an acid is added to the cleaning liquid and does not cause significant decomposition of hydrogen peroxide even when titanium is added to the cleaning liquid, and a cleaning method using the same. Therefore, high-precision and high-quality semiconductor elements can be produced with a high yield.

BRIEF DESCRIPTION OF THE DRAWINGS

FIG. 1 is a schematic cross sectional view of a semiconductor element comprising a barrier metal, a copper wiring or copper alloy wiring, a barrier dielectric film, a low-dielectric-constant interlayer dielectric film, a hard mask, an organosiloxane-based thin film, dry etching residue and a photoresist.

EMBODIMENTS FOR CARRYING OUT THE INVENTION

Hereinafter, the present invention will be described in detail based on embodiments, examples, etc., but the present invention is not limited to the embodiments, examples, etc. below and can be suitably changed and then practiced without departing from the gist of the present invention.

The cleaning liquid of the present invention comprises 10 to 30% by mass of hydrogen peroxide, 0.005 to 10% by mass of a quaternary ammonium hydroxide, 0.005 to 5% by mass of potassium hydroxide, 0.000005 to 0.005% by mass of an amino polymethylene phosphonic acid and water. Hereinafter, each of the components will be described in detail.

The range of the concentration of hydrogen peroxide to be used in the present invention is 10 to 30% by mass, preferably 13 to 25% by mass, and particularly preferably 15 to 20% by mass. When the concentration is 10 to 30% by mass, the hard mask, the organosiloxane-based thin film, dry etching residue and the photoresist can be removed effectively.

Specific examples of the quaternary ammonium hydroxide to be used in the present invention include tetramethylammonium hydroxide, tetraethylammonium hydroxide, tetrapropylammonium hydroxide, tetrabutylammonium hydroxide and benzyltrimethylammonium hydroxide. These quaternary ammonium hydroxides may be used solely, or two or more of them may be used in combination.

The range of the concentration of the quaternary ammonium hydroxide to be used in the present invention is 0.005 to 10% by mass, preferably 0.01 to 8% by mass, and particularly preferably 0.05 to 5% by mass. When the concentration is 0.005 to 10% by mass, the hard mask, the organosiloxane-based thin film, dry etching residue and the photoresist can be removed effectively while suppressing damage to the low-dielectric-constant interlayer dielectric film and the copper wiring. Even when an acid is added to the cleaning liquid, damage to the copper wiring is suppressed, and even when titanium is added to the cleaning liquid, significant hydrogen peroxide decomposition is not caused.

The range of the concentration of potassium hydroxide to be used in the present invention is 0.005 to 5% by mass, preferably 0.01 to 3% by mass, and particularly preferably 0.02 to 1% by mass. When the concentration is 0.005 to 5% by mass, the hard mask, the organosiloxane-based thin film, dry etching residue and the photoresist can be removed effectively while suppressing damage to the low-dielectric-constant interlayer dielectric film and the copper wiring.

Examples of the amino polymethylene phosphonic acid to be used in the present invention include amino tri(methylene phosphonic acid), ethylenediamine tetra(methylene phosphonic acid), diethylenetriamine penta(methylene phosphonic acid) and 1,2-propylenediamine tetra(methylene phosphonic acid). These amino polymethylene phosphonic acids may be used solely, or two or more of them may be used in combination.

The range of the concentration of the amino polymethylene phosphonic acid to be used in the present invention is 0.000005 to 0.005% by mass, preferably 0.00001 to 0.003% by mass, and particularly preferably 0.0001 to 0.003% by mass. When the concentration is 0.000005 to 0.005% by mass, damage to the copper wiring can be suppressed.

As a particularly preferred combination, the cleaning liquid of the present invention comprises 15 to 20% by mass of hydrogen peroxide, 0.01 to 8% by mass of the quaternary ammonium hydroxide, 0.02 to 1% by mass of potassium hydroxide and 0.00001 to 0.003% by mass of the amino polymethylene phosphonic acid.

The concentration of sodium as an impurity included in the cleaning liquid of the present invention is preferably 0.1 ppm or less (by mass), more preferably 0.05 ppm or less, and even more preferably 0.03 ppm or less. Note that since sodium is an inevitable impurity in the above-described potassium hydroxide, about 0.001 ppm of sodium is actually included in the composition for cleaning. When more than 0.1 ppm of sodium is included, characteristics of a semiconductor produced may be reduced.

For the hard mask for which the cleaning liquid of the present invention is used, for example, titanium nitride or titanium can be used.

In the cleaning liquid of the present invention, an additive which is conventionally used for a cleaning liquid for semiconductors may be blended without departing from the purpose of the present invention if desired.

For example, as an additive, a surfactant, a defoaming agent, etc. may be added.

The temperature for use of the cleaning liquid of the present invention is 20 to 80° C., preferably 25 to 70° C., and may be suitably selected based on etching conditions and the type of a semiconductor substrate to be used. Regarding the cleaning method of the present invention, ultrasonic wave can be used in combination therewith according to need.

The time for use of the cleaning liquid of the present invention is 0.3 to 20 minutes, preferably 0.5 to 10 minutes, and may be suitably selected based on etching conditions and the type of a semiconductor substrate to be used.

As a rinse liquid to be used after using the cleaning liquid of the present invention, an organic solvent such as alcohol can be used, but just rinsing with water is sufficient.

A semiconductor element and a display element, to which the present invention can be applied, comprise: a substrate material such as silicon, amorphous silicon, polysilicon and glass; an insulating material such as silicon oxide, silicon nitride, silicon carbide and derivatives thereof; a barrier material such as tantalum, tantalum nitride, ruthenium and ruthenium oxide; a wiring material such as copper and an copper alloy; a compound semiconductor such as gallium-arsenic, gallium-phosphorus, indium-phosphorus, indium-gallium-arsenic and indium-aluminium-arsenic; an oxide semiconductor such as chromium oxide, etc.

In general, as the low-dielectric-constant interlayer dielectric film, hydroxy silsesquioxane (HSQ)-based or methyl silsesquioxane (MSQ)-based OCD (trade name, Tokyo Ohka Kogyo Co., Ltd.), carbon-doped silicon oxide (SiOC)-based Black Diamond (trade name, Applied Materials), Aurora (trade name, ASM International) or Coral (trade name, Novellus Systems), or inorganic Orion (trade name, Trikon Tencnlogies) is used. The low-dielectric-constant interlayer dielectric film is not limited thereto.

In general, as the barrier metal, tantalum, tantalum nitride, ruthenium, manganese, magnesium, cobalt or any of oxides thereof is used. The barrier metal is not limited thereto.

In general, as the barrier dielectric film, silicon nitride, silicon carbide or silicon carbonitride is used. The barrier dielectric film is not limited thereto.

EXAMPLES

Hereinafter, the present invention will be more specifically described by way of examples and comparative examples. However, the present invention is not limited to the examples.
<Method for Evaluating the State of Removal of Materials and Damages and Device for Evaluation>

The state of removal of materials and damage were evaluated by means of SEM observation. As an SEM apparatus, an ultra-high resolution field-emission scanning electron microscope SU9000 manufactured by Hitachi High-Technologies Corporation was used.
<Method for Preparing Acid-Added Cleaning Liquid and Method for Evaluating Damage to Copper in the Case of Cleaning with Acid-Added Cleaning Liquid>

An acid-added cleaning liquid was prepared by mixing a cleaning liquid with 10% by mass of an aqueous solution of hydrofluoric acid at a mass ratio of 100:2. A semiconductor element having a copper wiring was immersed in the hydrofluoric acid-added cleaning liquid at a predetermined temperature for a predetermined period of time, and damage to the copper was observed by means of SEM observation.

<Hydrogen Peroxide Decomposition Rate of Titanium-Added Cleaning Liquid>

A composition obtained by mixing a cleaning liquid with titanium powder at a mass ratio of 100:0.005 was heated in a constant temperature water tank at 60° C. for 4 hours. The concentration of hydrogen peroxide before and after heating was measured by potentiometric titration (potassium permanganate was used), and the hydrogen peroxide decomposition rate of the composition was calculated according to the following calculation formula:

$$\text{Hydrogen peroxide decomposition rate \%} = 100 - 100 \times \frac{(\text{Weight of cleaning liquid after heating} \times \text{Concentration of hydrogen peroxide after heating})}{(\text{Weight of cleaning liquid before heating} \times \text{Concentration of hydrogen peroxide before heating})}$$

Judgment:

I. The state of removal of the organosiloxane-based thin film 6
  A: The organosiloxane-based thin film was completely removed.
  B: The organosiloxane-based thin film was almost removed.
  C: The organosiloxane-based thin film was not removed.
  A and B were regarded as acceptable.

II. The state of removal of the dry etching residue 8
  A: The dry etching residue was completely removed.
  B: The dry etching residue was almost removed.
  C: The dry etching residue was not removed.
  A and B were regarded as acceptable.

III. The state of removal of the altered photoresist 7
  A: The photoresist was completely removed.
  B: The photoresist was almost removed.
  C: The photoresist was not removed.
  A and B were regarded as acceptable.

IV. The state of removal of the titanium-based hard mask 5
  A: The hard mask was completely removed.
  B: The hard mask was almost removed.
  C: The hard mask was not removed.
  A and B were regarded as acceptable.

V. Damage to the copper 2
  A: The copper was not changed compared to the state before cleaning.
  B: The copper surface became a little bit rough.
  C: A big hole was observed in the copper.
  A and B were regarded as acceptable.

VI. Damage to the low-dielectric-constant interlayer dielectric film 4
  A: The low-dielectric-constant interlayer dielectric film was not changed compared to the state before cleaning.
  B: The low-dielectric-constant interlayer dielectric film was slightly recessed.
  C: The low-dielectric-constant interlayer dielectric film was significantly recessed.
  A and B were regarded as acceptable.

VII. Damage to the copper 2 in the case of cleaning with an acid-added cleaning liquid
  A: The copper was not changed compared to the state before cleaning.
  B: The copper surface became a little bit rough.
  C: A big hole was observed in the copper.
  A and B were regarded as acceptable.

VIII. Stability of hydrogen peroxide in a titanium-added cleaning liquid
  A: The decomposition rate of hydrogen peroxide was less than 20%.

B: The decomposition rate of hydrogen peroxide was 20 to 30%.

C: The decomposition rate of hydrogen peroxide was more than 30%.

-: Evaluation was not carried out because no hydrogen peroxide was contained before the start of heating.

A and B were regarded as acceptable.

Examples 1-22

In the test, a semiconductor element having a cross-sectional surface of a wiring structure as shown in FIG. 1 was used. In order to remove the hard mask 5 that is TiN, the organosiloxane-based thin film 6, the dry etching residue 8 and the photoresist 7, the semiconductor element was immersed in a cleaning liquid described in Table 1 at a temperature and for time described in Table 2, and after that, it was rinsed with ultrapure water and dried by means of dry nitrogen gas jet. The semiconductor element after cleaning was observed by SEM to judge the state of removal of each of the hard mask 5, the organosiloxane-based thin film 6, the dry etching residue 8 and the photoresist 7 and damage to each of the copper 2, tantalum (Ta)/tantalum nitride (TaN) that is the barrier metal 1, silicon carbide that is the barrier dielectric film 3 and carbon-doped silicon oxide that is the low-dielectric-constant interlayer dielectric film 4. In addition, the semiconductor element was immersed in a cleaning liquid obtained by adding an acid to the cleaning liquid described in Table 1 at a temperature and for time described in Table 2, and after that, it was rinsed with ultrapure water and dried by means of dry nitrogen gas jet. The semiconductor element after cleaning was observed by SEM to observe damage to the copper. The stability of hydrogen peroxide in the case where titanium was added to the cleaning liquid was also examined.

Regarding Examples 1-22 to which the cleaning liquids of the present invention shown in Table 2 were applied, it is understood that the hard mask 5, the organosiloxane-based thin film 6, the dry etching residue 8 and the photoresist 7 were completely removed while preventing damage to the copper 2 and the low-dielectric-constant interlayer dielectric film 4. In all the working examples, damage to the barrier metal 1 and the barrier dielectric film 3 was not observed. Further, even in the case of using the acid-added cleaning liquid, damage to the copper 2 was not observed. In the case where titanium was added to the cleaning liquid, the decomposition of hydrogen peroxide was 30% or less. The sodium concentration of each of the cleaning liquids shown in Table 1 was 0.1 ppm or less.

Comparative Example 1

A semiconductor element as shown in FIG. 1 was cleaned with the aqueous solution described in Patent Document 1, which comprises 15% by mass of hydrogen peroxide, 0.02% by mass of potassium hydroxide, 0.0005% by mass of 1,2-propylenediamine tetra(methylene phosphonic acid) and 84.9795% by mass of water (cleaning liquid 3A in Table 3). The cleaning conditions and evaluation results are shown in Table 4. The hard mask 5, the organosiloxane-based thin film 6, the dry etching residue 8 and the photoresist 7 were successfully removed. Damage to the low-dielectric-constant interlayer dielectric film 4 and the copper 2 was not observed. However, when using the acid-added cleaning liquid, damage to the copper 2 was observed, and when adding titanium to the cleaning liquid, significant decomposition of hydrogen peroxide was observed.

Comparative Example 2

A semiconductor element as shown in FIG. 1 was cleaned with the aqueous solution described in Patent Document 2, which comprises 15% by mass of hydrogen peroxide, 0.45% by mass of benzyltrimethylammonium hydroxide, 0.01% by mass of benzalkonium chloride and 84.54% by mass of water (cleaning liquid 3B in Table 3). The cleaning conditions and evaluation results are shown in Table 4. The hard mask 5 was successfully removed, but it was impossible to remove the organosiloxane-based thin film 6, the dry etching residue 8 and the photoresist 7. Damage to the low-dielectric-constant interlayer dielectric film 4 and the copper 2 was not observed. Even in the case of using the acid-added cleaning liquid, damage to the copper 2 was not observed. Even in the case of adding titanium to the cleaning liquid, the decomposition rate of hydrogen peroxide was low.

Comparative Example 3

A semiconductor element as shown in FIG. 1 was cleaned with the aqueous solution described in Patent Document 3, which comprises 28.4% by mass of hydrogen peroxide, 1.7% by mass of tetramethylammonium hydroxide, 1.4% by mass of ethylenediaminetetraacetic acid and 68.5% by mass of water (cleaning liquid 3C in Table 3). The cleaning conditions and evaluation results are shown in Table 4. The hard mask 5 was successfully removed, but it was impossible to remove the organosiloxane-based thin film 6, the dry etching residue 8 and the photoresist 7. Damage to the low-dielectric-constant interlayer dielectric film 4 was not observed, but damage to the copper 2 was observed. In addition, in the case of using the acid-added cleaning liquid, damage to the copper 2 was observed. In the case of adding titanium to the cleaning liquid, significant decomposition of hydrogen peroxide was observed.

Comparative Example 4

A semiconductor element as shown in FIG. 1 was cleaned with the aqueous solution described in Patent Document 4, which comprises 0.2% by mass of hydrogen peroxide, 0.4% by mass of tetramethylammonium hydroxide, 0.1% by mass of potassium hydroxide, 0.2% by mass of orthoperiodic acid, 0.02% by mass of diethylenetriamine, 0.1% by mass of Emulgen A-90, 0.01% by mass of cetyltrimethylammonium chloride, 0.05% by mass of laurylpyridinium chloride, 0.5% by mass of trimethyl ammonium fluoride and 98.42% by mass of water (cleaning liquid 3D in Table 3). The cleaning conditions and evaluation results are shown in Table 4. It was impossible to remove the hard mask 5, the organosiloxane-based thin film 6, the dry etching residue 8 and the photoresist 7. Damage to the low-dielectric-constant interlayer dielectric film 4 and the copper 2 was observed. In the case of using the acid-added cleaning liquid, damage to the copper 2 was observed. In the case of adding titanium to the cleaning liquid, the decomposition rate of hydrogen peroxide was low.

Comparative Example 5

A semiconductor element as shown in FIG. 1 was cleaned with a cleaning liquid obtained by adding hydroxy polycarboxylic acid described in Patent Document 5, which is a chelating agent for forming a titanium complex compound, instead of the quaternary ammonium hydroxide, to hydrogen peroxide, potassium hydroxide, amino polymethylene phosphonic acid and water (cleaning liquid 3E in Table 3). The cleaning conditions and evaluation results are shown in Table 4. The hard mask 5, the organosiloxane-based thin film 6, the dry etching residue 8 and the photoresist 7 were almost removed. Damage to the low-dielectric-constant interlayer dielectric film 4 was not observed, but damage to the copper 2 was observed. In the case of using the acid-added cleaning liquid, damage to the copper 2 was observed. In the case of adding titanium to the cleaning liquid, the decomposition rate of hydrogen peroxide was not so high. Accordingly, even when the acid was added to the cleaning liquid in which hydrogen peroxide, potassium hydroxide, amino polymethylene phosphonic acid and water were combined, hydroxy polycarboxylic acid damaged the copper wiring.

Regarding the cleaning liquids described in Patent Documents 1-5 (Comparative Examples 1-5), it was found that the cleaning liquids cannot be used as cleaning liquids for removing the hard mask, the organosiloxane-based thin film, the dry etching residue and the photoresist while suppressing damage to the barrier metal, the low-dielectric-constant interlayer dielectric film and the copper wiring because cleaning is not sufficient, or the copper wiring is damaged, or the stability of the cleaning liquid is low (Table 4).

Comparative Example 6

A semiconductor element as shown in FIG. 1 was cleaned with an aqueous solution comprising 17% by mass of hydrogen peroxide, 0.5% by mass of tetramethylammonium hydroxide, 0.2% by mass of potassium hydroxide and 82.3% by mass of water (cleaning liquid 3F in Table 3). The cleaning conditions and evaluation results are shown in Table 4. The hard mask 5, the organosiloxane-based thin film 6, the dry etching residue 8 and the photoresist 7 were successfully removed. Damage to the low-dielectric-constant interlayer dielectric film 4 and the copper 2 was not observed. Even in the case of using the acid-added cleaning liquid, damage to the copper 2 was not observed. However, in the case where titanium was added to the cleaning liquid, significant decomposition of hydrogen peroxide was observed.

Comparative Example 7

A semiconductor element as shown in FIG. 1 was cleaned with an aqueous solution comprising 17% by mass of hydrogen peroxide, 0.5% by mass of tetramethylammonium hydroxide, 0.0005% by mass of diethylenetriamine penta (methylene phosphonic acid) and 82.4995% by mass of water (cleaning liquid 3G in Table 3). The cleaning conditions and evaluation results are shown in Table 4. The hard mask 5 was successfully removed, but it was impossible to remove the organosiloxane-based thin film 6, the dry etching residue 8 and the photoresist 7.

Comparative Example 8

A semiconductor element as shown in FIG. 1 was cleaned with an aqueous solution comprising 17% by mass of hydrogen peroxide, 0.2% by mass of potassium hydroxide, 0.0005% by mass of diethylenetriamine penta(methylene phosphonic acid) and 82.7995% by mass of water (cleaning liquid 3H in Table 3). The cleaning conditions and evaluation results are shown in Table 4. The hard mask 5, the organosiloxane-based thin film 6, the dry etching residue 8 and the photoresist 7 were successfully removed. Damage to the low-dielectric-constant interlayer dielectric film 4 and the copper 2 was not observed. However, in the case of using the acid-added cleaning liquid, damage to the copper 2 was observed, and when titanium was added to the cleaning liquid, significant decomposition of hydrogen peroxide was observed.

Comparative Example 9

A semiconductor element as shown in FIG. 1 was cleaned with an aqueous solution comprising 0.5% by mass of tetramethylammonium hydroxide, 0.2% by mass of potassium hydroxide, 0.0005% by mass of diethylenetriamine penta (methylene phosphonic acid) and 99.2995% by mass of water (cleaning liquid 3I in Table 3). The cleaning conditions and evaluation results are shown in Table 4. It was impossible to remove the hard mask 5, the organosiloxane-based thin film 6, the dry etching residue 8 and the photoresist 7. Damage to the low-dielectric-constant interlayer dielectric film 4 and the copper 2 was observed.

Accordingly, in the case of using the cleaning liquids 3F, 3G, 3H and 3I, it was insufficient to remove the hard mask, the organosiloxane-based thin film, the dry etching residue and the photoresist while suppressing damage to the low-dielectric-constant interlayer dielectric film and the copper wiring, or the copper wiring was damaged when the acid was added to the cleaning liquid, or the stability of hydrogen peroxide after the addition of titanium was insufficient (Table 4).

Comparative Example 10

A semiconductor element as shown in FIG. 1 was cleaned with an aqueous solution comprising 17% by mass of hydrogen peroxide, 0.2% by mass of potassium hydroxide, 0.1% by mass of 1,3-propanediamine, 0.0005% by mass of diethylenetriamine penta(methylene phosphonic acid) and 82.6995% by mass of water (cleaning liquid 3J in Table 3). The cleaning conditions and evaluation results are shown in Table 4. The hard mask 5, the organosiloxane-based thin film 6, the dry etching residue 8 and the photoresist 7 were successfully removed. Damage to the low-dielectric-constant interlayer dielectric film 4 was not observed, but damage to the copper 2 was observed. In the case of using the acid-added cleaning liquid, damage to the copper 2 was observed, and when titanium was added to the cleaning liquid, significant decomposition of hydrogen peroxide was observed.

Comparative Example 11

A semiconductor element as shown in FIG. 1 was cleaned with an aqueous solution comprising 17% by mass of hydrogen peroxide, 0.2% by mass of potassium hydroxide, 0.04% by mass of ammonia, 0.0005% by mass of diethylenetriamine penta(methylene phosphonic acid) and 82.7595% by mass of water (cleaning liquid 3K in Table 3). The cleaning conditions and evaluation results are shown in Table 4. The hard mask 5, the organosiloxane-based thin film 6, the dry etching residue 8 and the photoresist 7 were successfully removed. Damage to the low-dielectric-constant interlayer dielectric film 4 was not observed, but damage to the copper 2 was observed. In the case of using the acid-added cleaning liquid, damage to the copper 2 was observed, and when titanium was added to the cleaning liquid, significant decomposition of hydrogen peroxide was observed.

Comparative Example 12

A semiconductor element as shown in FIG. 1 was cleaned with an aqueous solution comprising 17% by mass of hydrogen peroxide, 0.2% by mass of potassium hydroxide, 0.2% by mass of 2-(methylamino)ethanol, 0.0005% by mass of diethylenetriamine penta(methylene phosphonic acid) and 82.5995% by mass of water (cleaning liquid 3L in Table 3). The cleaning conditions and evaluation results are shown in Table 4. The hard mask 5, the organosiloxane-based thin film 6, the dry etching residue 8 and the photoresist 7 were successfully removed. Damage to the low-dielectric-constant interlayer dielectric film 4 was not observed, but damage to the copper 2 was observed. In the case of using the acid-added cleaning liquid, damage to the copper 2 was observed, and when titanium was added to the cleaning liquid, significant decomposition of hydrogen peroxide was observed.

TABLE 1

| Cleaning liquid | Hydrogen peroxide Concentration % by mass | Quaternary ammonium hydroxide Type | Concentration % by mass | Potassium hydroxide Concentration % by mass | Amino polymethylene phosphonic acid Type | Concentration % by mass | Water Concentration % by mass |
|---|---|---|---|---|---|---|---|
| 1A | 17 | TMAH | 0.5 | 0.2 | Diethylenetriamine penta(methylene phosphonic acid) | 0.0005 | 82.2995 |
| 1B | 15 | TEAH | 0.5 | 0.2 | Diethylenetriamine penta(methylene phosphonic acid) | 0.0005 | 84.2995 |
| 1C | 17 | TPAH | 0.5 | 0.2 | Diethylenetriamine penta(methylene phosphonic acid) | 0.0005 | 82.2995 |
| 1D | 17 | TBAH | 0.5 | 0.2 | Diethylenetriamine penta(methylene phosphonic acid) | 0.0005 | 82.2995 |
| 1E | 17 | BTMAH | 0.5 | 0.2 | 1,2-propylenediamine tetra(methylene phosphonic acid) | 0.0005 | 82.2995 |
| 1F | 17 | TMAH | 0.05 | 0.5 | 1,2-propylenediamine tetra(methylene phosphonic acid) | 0.0005 | 82.4495 |
| 1G | 17 | TEAH | 0.5 | 0.02 | 1,2-propylenediamine tetra(methylene phosphonic acid) | 0.0005 | 82.4795 |
| 1H | 17 | TPAH | 0.5 | 0.2 | 1,2-propylenediamine tetra(methylene phosphonic acid) | 0.0005 | 82.2995 |
| 1I | 17 | TBAH | 0.5 | 0.2 | 1,2-propylenediamine tetra(methylene phosphonic acid) | 0.0005 | 82.2995 |
| 1J | 20 | BTMAH | 3 | 0.2 | 1,2-propylenediamine tetra(methylene phosphonic acid) | 0.0001 | 76.7999 |
| 1K | 17 | TMAH | 0.5 | 0.2 | Amino tri(methylene phosphonic acid) | 0.0005 | 82.2995 |
| 1L | 17 | TMAH | 0.5 | 0.2 | Ethylenediamine tetra(methylene phosphonic acid) | 0.0005 | 82.2995 |
| 1M | 10 | TMAH | 2 | 1 | Diethylenetriamine penta(methylene phosphonic acid) | 0.0001 | 76.9999 |
| 1N | 13 | TMAH | 1 | 1 | Diethylenetriamine penta(methylene phosphonic acid) | 0.0001 | 84.9999 |
| 1O | 25 | TMAH | 4 | 0.2 | Diethylenetriamine penta(methylene phosphonic acid) | 0.003 | 70.797 |
| 1P | 30 | TMAH | 5 | 0.2 | Diethylenetriamine penta(methylene phosphonic acid) | 0.003 | 64.797 |
| 1Q | 17 | TMAH | 0.01 | 0.2 | Diethylenetriamine penta(methylene phosphonic acid) | 0.0005 | 82.7895 |
| 1R | 17 | TMAH | 0.03 | 0.5 | Diethylenetriamine penta(methylene phosphonic acid) | 0.0005 | 82.4695 |
| 1S | 17 | TMAH | 0.05 | 0.01 | Diethylenetriamine penta(methylene phosphonic acid) | 0.0005 | 82.9395 |
| 1T | 17 | TMAH | 0.5 | 0.8 | Diethylenetriamine penta(methylene phosphonic acid) | 0.0005 | 81.6995 |
| 1U | 17 | TMAH | 0.5 | 0.2 | Diethylenetriamine penta(methylene phosphonic acid) | 0.00001 | 82.29999 |

TABLE 1-continued

| Cleaning liquid | Hydrogen peroxide Concentration % by mass | Quaternary ammonium hydroxide Type | Quaternary ammonium hydroxide Concentration % by mass | Potassium hydroxide Concentration % by mass | Amino polymethylene phosphonic acid Type | Amino polymethylene phosphonic acid Concentration % by mass | Water Concentration % by mass |
|---|---|---|---|---|---|---|---|
| 1V | 17 | TMAH | 0.5 | 0.2 | Diethylenetriamine penta(methylene phosphonic acid) | 0.005 | 82.295 |

TMAH: tetramethylammonium hydroxide
TEAH: tetraethylammonium hydroxide
TPAH: tetrapropylammonium hydroxide
TBAH: tetrabutylammonium hydroxide
BTMAH: benzyltrimethylammonium hydroxide

TABLE 2

| Example | Cleaning liquid | Temperature/ °C. | Immersion time/min | State of removal I | State of removal II | State of removal III | State of removal IV | Damage V | Damage VI | Damage VII | Stability VIII |
|---|---|---|---|---|---|---|---|---|---|---|---|
| 1 | 1A | 50 | 3 | A | A | A | A | A | A | A | A |
| 2 | 1B | 25 | 10 | A | A | A | A | A | A | A | A |
| 3 | 1C | 50 | 3 | A | A | A | A | A | A | A | A |
| 4 | 1D | 50 | 3 | A | A | A | A | A | A | A | A |
| 5 | 1E | 50 | 3 | A | A | A | A | A | A | A | A |
| 6 | 1F | 50 | 3 | A | A | A | A | A | A | A | A |
| 7 | 1G | 50 | 3 | A | A | A | A | A | A | A | A |
| 8 | 1H | 50 | 3 | A | A | A | A | A | A | A | A |
| 9 | 1I | 50 | 3 | A | A | A | A | A | A | A | A |
| 10 | 1J | 70 | 0.5 | A | A | A | A | A | A | A | A |
| 11 | 1K | 50 | 3 | A | A | A | A | A | A | A | A |
| 12 | 1L | 50 | 3 | A | A | A | A | A | A | A | A |
| 13 | 1M | 80 | 0.3 | B | B | B | B | B | B | A | A |
| 14 | 1N | 80 | 0.3 | B | B | B | A | B | B | A | A |
| 15 | 1O | 35 | 5 | A | A | A | A | B | B | A | A |
| 16 | 1P | 20 | 5 | A | A | A | A | B | B | A | B |
| 17 | 1Q | 50 | 3 | A | A | A | A | A | A | B | B |
| 18 | 1R | 50 | 3 | A | A | A | A | A | A | B | A |
| 19 | 1S | 50 | 20 | B | B | B | B | A | B | B | A |
| 20 | 1T | 50 | 1 | A | A | A | A | A | B | A | A |
| 21 | 1U | 50 | 3 | A | A | A | A | A | A | A | B |
| 22 | 1V | 50 | 5 | A | A | A | A | B | A | A | A |

State of removal I: the state of removal of the organosiloxane-based thin film 6
State of removal II: the state of removal of the dry etching residue 8
State of removal III: the state of removal of the altered photoresist 7
State of removal IV: the state of removal of the titanium-based hard mask 5
Damage V: damage to the copper 2
Damage VI: damage to the low-dielectric-constant interlayer dielectric film 4
Damage VII: damage to the copper 2 in the case of cleaning with the acid-added cleaning liquid
Stability VIII: stability of hydrogen peroxide in the case of adding titanium

TABLE 3

| Cleaning liquid | Composition of cleaning liquid (concentration: % by mass) |
|---|---|
| 3A | hydrogen peroxide 15%, potassium hydroxide 0.02%, 1,2-propylenediamine tetra(methylene phosphonic acid) 0.0005%, water 84.9795% |
| 3B | hydrogen peroxide 15%, benzyltrimethylammonium hydroxide 0.45%, benzalkonium chloride 0.01%, water 84.54% |
| 3C | hydrogen peroxide 28.4%, TMAH 1.7%, ethylenediaminetetraacetic acid 1.4%, water 68.5% |
| 3D | hydrogen peroxide 0.2%, TMAH 0.4%, potassium hydroxide 0.1%, orthoperiodic acid 0.2%, diethylenetriamine 0.02%, Emulgen A-90 0.1%, cetyltrimethylammonium chloride 0.01%, laurylpyridinium chloride 0.05%, trimethyl ammonium fluoride 0.5%, water 98.42% |
| 3E | hydrogen peroxide 17%, potassium hydroxide 0.2%, citric acid 0.01%, diethylenetriamine penta(methylene phosphonic acid) 0.0005%, water 82.7895% |
| 3F | hydrogen peroxide 17%, TMAH 0.5%, potassium hydroxide 0.2%, water 82.3% |
| 3G | hydrogen peroxide 17%, TMAH 0.5%, diethylenetriamine penta(methylene phosphonic acid) 0.0005%, water 82.4995% |
| 3H | hydrogen peroxide 17%, potassium hydroxide 0.2%, diethylenetriamine penta(methylene phosphonic acid) 0.0005%, water 82.7995% |

TABLE 3-continued

| Cleaning liquid | Composition of cleaning liquid (concentration: % by mass) |
|---|---|
| 3I | TMAH 0.5%, potassium hydroxide 0.2%, diethylenetriamine penta(methylene phosphonic acid) 0.0005%, water 99.2995% |
| 3J | hydrogen peroxide 17%, potassium hydroxide 0.2%, 1,3-propanediamine 0.1%, diethylenetriamine penta(methylene phosphonic acid) 0.0005%, water 82.6995% |
| 3K | hydrogen peroxide 17%, potassium hydroxide 0.2%, ammonia 0.04%, diethylenetriamine penta(methylene phosphonic acid) 0.0005%, water 82.7595% |
| 3L | hydrogen peroxide 17%, potassium hydroxide 0.2%, 2-(methylamino)ethanol 0.2%, diethylenetriamine penta(methylene phosphonic acid) 0.0005%, water 82.5995% |

TABLE 4

| Comparative Example | Cleaning liquid | Temperature/ °C. | Immersion time/min | State of removal | | | | Damage | | | Stability |
|---|---|---|---|---|---|---|---|---|---|---|---|
| | | | | I | II | III | IV | V | VI | VII | VIII |
| 1 | 3A | 50 | 3 | A | A | A | A | A | A | C | C |
| 2 | 3B | 50 | 3 | C | C | C | A | A | A | A | A |
| 3 | 3C | 50 | 3 | C | C | C | A | C | A | C | C |
| 4 | 3D | 80 | 20 | C | C | C | C | C | C | C | A |
| 5 | 3E | 50 | 5 | B | B | B | B | C | A | C | B |
| 6 | 3F | 50 | 5 | A | A | A | A | A | A | A | C |
| 7 | 3G | 50 | 5 | C | C | C | A | A | A | A | A |
| 8 | 3H | 50 | 3 | A | A | A | A | A | A | C | C |
| 9 | 3I | 50 | 3 | C | C | C | C | C | C | C | — |
| 10 | 3J | 50 | 3 | A | A | A | A | C | A | C | C |
| 11 | 3K | 50 | 3 | A | A | A | A | C | A | C | C |
| 12 | 3L | 50 | 3 | A | A | A | A | C | A | C | C |

State of removal I: the state of removal of the organosiloxane-based thin film 6
State of removal II: the state of removal of the dry etching residue 8
State of removal III: the state of removal of the altered photoresist 7
State of removal IV: the state of removal of the titanium-based hard mask 5
Damage V: damage to the copper 2
Damage VI: damage to the low-dielectric-constant interlayer dielectric film 4
Damage VII: damage to the copper 2 in the case of cleaning with the acid-added cleaning liquid
Stability VIII: stability of hydrogen peroxide in the case of adding titanium

EXPLANATIONS OF LETTERS OR NUMERALS

1: barrier metal
2: copper or copper alloy wiring
3: barrier dielectric film
4: low-dielectric-constant interlayer dielectric film
5: hard mask
6: organosiloxane-based thin film
7: altered photoresist
8: dry etching residue

The invention claimed is:

1. A cleaning liquid,
comprising 10 to 30% by mass of hydrogen peroxide, 0.005 to 10% by mass of a quaternary ammonium hydroxide, 0.005 to 5% by mass of potassium hydroxide, 0.000005 to 0.005% by mass of an amino polymethylene phosphonic acid and water.

2. The cleaning liquid according to claim 1, wherein the quaternary ammonium hydroxide is at least one selected from the group consisting of tetramethylammonium hydroxide, tetraethylammonium hydroxide, tetrapropylammonium hydroxide, tetrabutylammonium hydroxide and benzyltrimethylammonium hydroxide.

3. The cleaning liquid according to claim 1, wherein the amino polymethylene phosphonic acid is at least one selected from the group consisting of amino tri(methylene phosphonic acid), ethylenediamine tetra(methylene phosphonic acid), diethylenetriamine penta(methylene phosphonic acid) and 1,2-propylenediamine tetra(methylene phosphonic acid).

4. The cleaning liquid according to claim 1, wherein the sodium concentration is 0.1 ppm or less.

5. A method for cleaning a semiconductor element removing a hard mask, an organosiloxane-based thin film, a dry etching residue and a photoresist with a cleaning liquid comprising 10 to 30% by mass of hydrogen peroxide, 0.005 to 10% by mass of a quaternary ammonium hydroxide, 0.005 to 5% by mass of potassium hydroxide, 0.000005 to 0.005% by mass of an amino polymethylene phosphonic acid and water, the method comprising laminating a barrier dielectric film, a low-dielectric-constant interlayer dielectric film, the hard mask, the organosiloxane-based thin film and the photoresist on a substrate having a barrier metal, a copper wiring or copper alloy wiring and a low-dielectric-constant interlayer dielectric film;

after that, subjecting the photoresist to selective exposure and development to form a photoresist pattern; and then cleaning the semiconductor element in which the organosiloxane-based thin film, the hard mask, the low-dielectric-constant interlayer dielectric film and the barrier dielectric film are subjected to dry etching utilizing the photoresist pattern as a mask, with the cleaning liquid to remove the hard mask, the organosiloxane-based thin film, the dry etching residue and the photoresist.

6. The cleaning method according to claim 5, wherein the hard mask comprises titanium nitride or titanium.

7. The cleaning method according to claim 5, wherein the quaternary ammonium hydroxide is at least one selected from the group consisting of tetramethylammonium hydroxide, tetraethylammonium hydroxide, tetrapropylammonium hydroxide, tetrabutylammonium hydroxide and benzyltrimethylammonium hydroxide.

8. The cleaning method according to claim 5, wherein the amino polymethylene phosphonic acid is at least one selected from the group consisting of amino tri(methylene phosphonic acid), ethylenediamine tetra(methylene phosphonic acid), diethylenetriamine penta(methylene phosphonic acid) and 1,2-propylenediamine tetra(methylene phosphonic acid).

9. The cleaning method according to claim 5, wherein the sodium content is 0.1 ppm or less.

\* \* \* \* \*